United States Patent
LeStrange et al.

(10) Patent No.: US 10,759,188 B2
(45) Date of Patent: *Sep. 1, 2020

(54) SYSTEM FOR PROVIDING MULTIPLE SURFACE TREATMENTS TO THREE-DIMENSIONAL OBJECTS PRIOR TO PRINTING

(71) Applicant: Xerox Corporation, Norwalk, CT (US)

(72) Inventors: Jack T. LeStrange, Macedon, NY (US); Anthony S. Condello, Webster, NY (US); Mandakini Kanungo, Penfield, NY (US); Peter J. Knausdorf, Henrietta, NY (US)

(73) Assignee: Xerox Corporation, Norwalk, CT (US)

( * ) Notice: Subject to any disclaimer, the term of this patent is extended or adjusted under 35 U.S.C. 154(b) by 525 days.

This patent is subject to a terminal disclaimer.

(21) Appl. No.: 15/494,830

(22) Filed: Apr. 24, 2017

(65) Prior Publication Data

US 2018/0304643 A1    Oct. 25, 2018

(51) Int. Cl.
*B41J 3/407*    (2006.01)
*H01J 37/32*    (2006.01)
*B41J 11/00*    (2006.01)

(52) U.S. Cl.
CPC ......... *B41J 3/4073* (2013.01); *B41J 11/0015* (2013.01); *H01J 37/32009* (2013.01); *H01J 37/32449* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 5,922,161 A | 7/1999 | Wu et al. | |
| 6,812,157 B1* | 11/2004 | Gadgil | C23C 16/45551 117/200 |
| 7,467,847 B2* | 12/2008 | Baxter | B41J 3/4073 347/41 |
| 2003/0175488 A1 | 9/2003 | Asthana et al. | |
| 2004/0091633 A1 | 5/2004 | Wilson, II et al. | |
| 2005/0212837 A1* | 9/2005 | Nakagawa | B01L 3/0268 347/8 |
| 2010/0178512 A1 | 7/2010 | Giesenberg et al. | |
| 2011/0293848 A1 | 12/2011 | Kohlweyer | |
| 2015/0298467 A1* | 10/2015 | Cofler | B41J 3/4073 347/16 |

FOREIGN PATENT DOCUMENTS

JP    H08-41227 A    2/1996

* cited by examiner

*Primary Examiner* — Karla A Moore
(74) *Attorney, Agent, or Firm* — Maginot Moore & Beck LLP

(57) ABSTRACT

A surface treatment system includes a holder configured to secure an object within the holder and a plurality of surface treatment devices. Each surface treatment device is configured to treat a surface of the object within the holder differently than each of the other surface treatment devices in the plurality of surface treatment devices. A controller is configured to operate the surface treatment devices independently of one another so less than all of the devices can be operated to treat an object surface. Thus, the surface treatment system is capable of treating a wide range of materials for printing by a direct-to-object printer.

6 Claims, 3 Drawing Sheets

SYSTEM FOR PROVIDING MULTIPLE SURFACE TREATMENTS TO THREE-DIMENSIONAL OBJECTS PRIOR TO PRINTING

TECHNICAL FIELD

This disclosure is directed to printers and, more particularly, to systems for treating the surfaces of three-dimensional (3D) objects to prepare the surfaces for printing.

BACKGROUND

Printers have been developed that can print text and graphics with multiple colors directly onto the surface of 3D objects. These printers, known as direct-to-object (DTO) printers, enable a small number of objects, even a single object, to be printed. These printers are particularly advantageous in retail environments where unprinted objects can be kept and then printed to provide customized appearances to the objects. This flexibility enables an unprinted inventory of objects, such as various types of balls used in various sports, to be kept at the location and then printed with the logos of particular teams. Consequently, an inventory of objects with a particular logo or color scheme is not required.

One of the issues related to printing objects with a DTO printer is the wide variety of materials, such as metal, plastics, fabrics, and the like, that are used to make the 3D objects. These different materials have a corresponding wide range of surface energies. The surface energies of many of these materials adversely impact the adhesion and durability of ink images on these surfaces. Some of these materials require some type of surface pretreatment to increase the surface energy of the material for durable printing. Typical surface treatment processes include but are not limited to: (1) general cleaning using detergents or solvents, (2) texturing using sanding, sandblasting, plasma etching or the like, (3) low pressure plasma exposure or plasma etching, (4) atmospheric pressure plasma treatments, such as corona, chemical corona, blown arc, plasma jet, and blown ion processes, (5) the application of chemical primers, and (6) flame treatment of surfaces.

Currently, many facilities having DTO printers manually treat the objects prior to printing. Objects requiring only hand buffing and an isopropyl alcohol (IPA) wipe are amendable to manual treatment, while other objects requiring more involved treatments, such as significant exposure time in a low pressure plasma chamber, are not as amenable. Other objects may require a series of different types of surface treatment to achieve optimal results. For instance, some objects are best prepared for printing by hand buffing the object, then applying an IPA wipe followed by flame treatment of the surface. The useful lifetime of surface treatments is variable and range from a few minutes to months depending on the material treated, the process used to treat the material, and the environment in which the object is stored. The general rule of thumb is that the more aggressive the treatment is to get an ink to wet and adhere to a material, the shorter the duration of the treatment. Therefore, a system that successfully treats a wide range of materials, automates the surface treatment procedure to remove human variability and exposure to chemicals, and treats the objects immediately prior to printing would be useful.

SUMMARY

An object surface treatment system provides a plurality of surface treatments to raise the surface energies of objects to improve the printing of the objects with DTO printers. The system includes a holder configured to secure an object within the holder, and a plurality of surface treatment devices, each surface treatment device being configured to treat a surface of the object within the holder differently than each of the other surface treatment devices in the plurality of surface treatment devices.

Another embodiment of the object surface treatment system enables the surface energy of objects made from a wide range of materials to be raised immediately prior to printing by the printer. The system includes a holder configured to secure an object within the holder, and a plurality of surface treatment devices, each surface treatment device being configured to treat a surface of the object within the holder differently than each of the other surface treatment devices in the plurality of surface treatment devices.

BRIEF DESCRIPTION OF THE DRAWINGS

The foregoing aspects and other features of an object surface treatment system that provides a plurality of surface treatments to raise the surface energies of objects to improve the printing of the objects with DTO printers are explained in the following description, taken in connection with the accompanying drawings.

DETAILED DESCRIPTION

Figure 1:
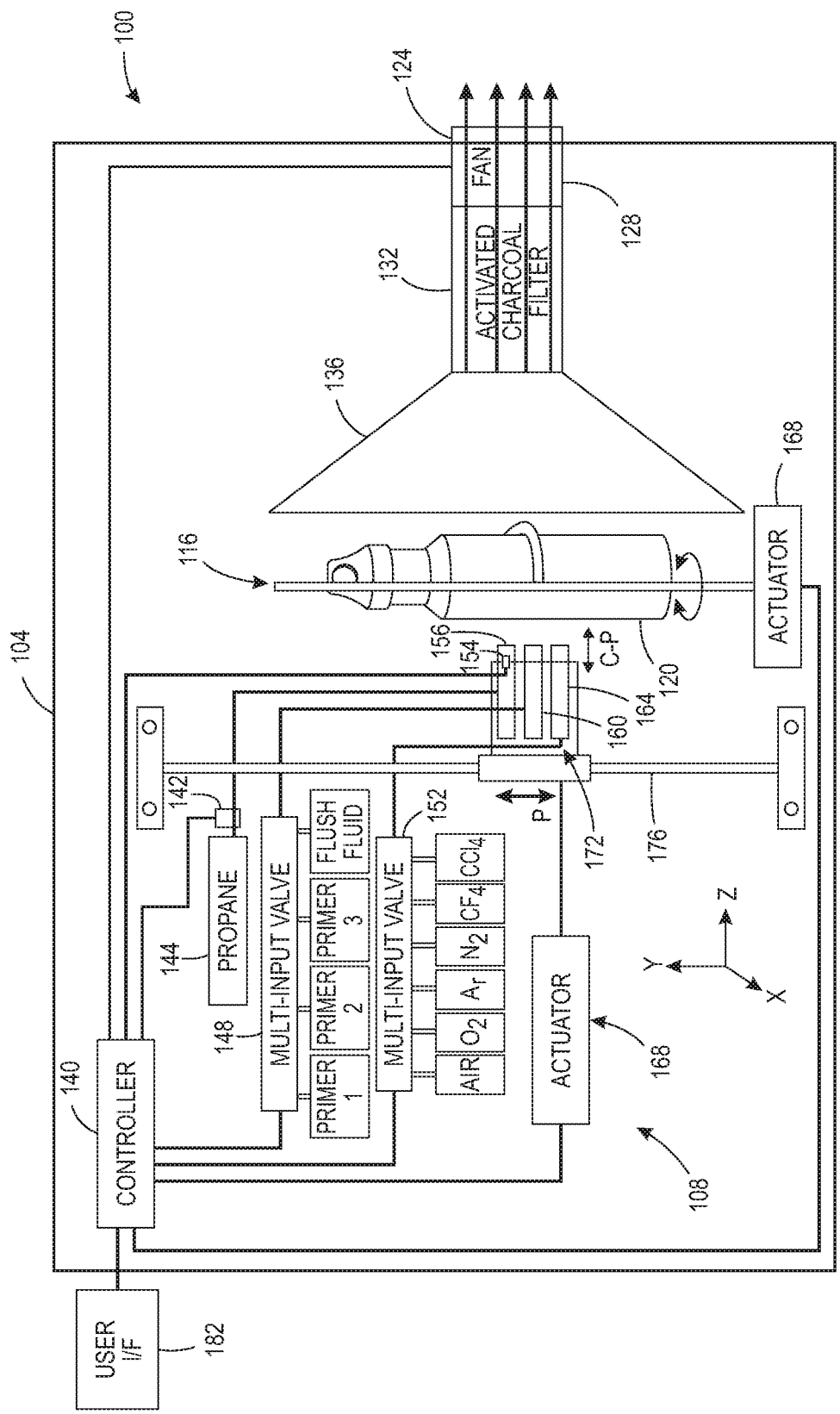
FIG. 1 is a schematic diagram of a system configured to apply multiple surface treatments to multiple types of object materials immediately prior to the objects being printed.

For a general understanding of the environment for the device disclosed herein as well as the details for the device, reference is made to the drawings. In the drawings, like reference numerals designate like elements.

As used herein, the word "printer" encompasses any apparatus that produces images with one or more marking materials on media or objects. As used herein, the term "process direction" (P) refers to a direction of movement of an object through a printer having at least one printhead or through a surface treatment system having a plurality of surface treatment devices. As used herein, the term "cross-process" direction (CP) refers to an axis that is perpendicular to the process direction. As used in this document, the word "surface treatment" means any process that raises the surface energy of a material to improve the wettability and durability of ink on the surface.

FIG. 1 is a schematic diagram of a system configured to operate a plurality of surface treatment devices to apply multiple surface treatments to multiple types of object materials immediately prior to the objects being printed. The system includes a housing 104 in which a surface treatment system 108 is configured to treat the surfaces of objects 120 carried by a holder 116. In FIG. 1, the object 120 is a water bottle, but the holder can be configured to secure other types of objects. As used in this document, the word "secure" means a structure configured to maintain an object in a particular orientation until the object is released from the structure. The housing 104 includes walls that enclose the system 108, the holder 116, and the object 120 to contain the materials used to treat the surface of an object. One wall of the housing 104 includes a vent opening 124 in which a fan 128 is positioned to pull materials and fumes from an overspray structure 136 through a filter 132. Thus, the materials used and the fumes produced by the materials can be removed from the air surrounding the object 120 and filtered before being exhausted from the housing 104. The system 100 includes a plurality of surface treatment devices that are operated independently to apply surface treatments to the object 120. As used in this document, the term "operated independently" or its equivalent means to operate a device in a plurality of devices while the other devices in the plurality are not operated.

With continued reference to FIG. 1, the system 108 includes a controller 140 that is operatively connected to a combustible material source 144 for a flame surface treatment device 156, a multi-input valve 148 for a chemical surface treatment device 160, and a multi-input valve 152 for a gas plasma surface treatment device 164, and actuators 168 for moving a surface treatment device head 172 along a support member 176 and manipulating the position of the object 120. The flame surface treatment device 156, the chemical surface treatment device 160, and the gas plasma surface treatment device 163 are integrated in surface treatment device head 172 and are configured with actuators to bidirectionally movement in the cross-process direction C-P that is perpendicular to the bidirectional process direction P along the support member 176. This bidirectional movement of the various surface treatment devices is performed by the controller 140 operating actuators internal to the surface treatment device head 172. The actuators are operatively connected to the devices in a one-to-one correspondence. Thus, after an object 120 is secured within holder 116, the controller 140 can operate an actuator 168 to move the surface treatment head 172 bidirectionally along the support member 176 and to operate another actuator 168 to rotate the holder 116 and the object 120 to present various surfaces to the surface treatment head 172 for treatment. The controller 140 is also operatively connected to the surface treatment device head 172 to operate the flame surface treatment device, the chemical surface treatment device, and the gas plasma surface treatment device independently of one another so the controller can operate less than all of the surface treatment devices to treat an object surface. That is, the controller can operate all of the surface treatment devices or as few as one surface treatment device to treat the surface of an object.

As shown in FIG. 1, the combustible source 144 is pneumatically connected to the flame surface treatment device 156. In response to the controller 140 operating a valve 142 in the line to the device 156 to open, a combustible fluid or gas from the pressurized source 144 flows to the flame treatment device 156 where an ignitor 154 of the device 156 is operated to form a flame for treatment of an object surface. When the flame treatment is complete, the controller closes the valve 142 to terminate the flow of the combustible substance to the device 156. As used in this document, the term "combustible substance" means a gas or fluid that flows under pressure and that ignites to form a flame. Such materials include propane and natural gas, for example.

The multi-input valve 148 is pneumatically connected to a plurality of sources of chemical surface treatment materials and a source of a flush fluid. The controller 140 operates the multi-input valve 148 to couple one of the sources of chemical surface treatment materials exclusively to the chemical surface treatment device 160. As used in this document, "chemical surface treatment device" means any device that emits a substance so the substance contacts the surface of the object being treated and increases the surface energy of the object. Such a device can be, for example, a nozzle, a spray head, an applicator, or a brush. As used in this document, the term "couple exclusively" or its equivalent means coupling a source in a plurality of sources to a device while the remaining sources in the plurality are not in direct fluid communication with the device. By selectively operating the chemical surface treatment device 160 as the actuators 168 move the head 172 and rotate the object 120, the chemical discharged from the chemical surface treatment device 160 can be applied to different areas of the object surface selectively. After one or more chemicals are appropriately applied to the object surface and the object is removed from the position opposite the head 172, the controller operates the multi-input valve 148 to couple the source of flush fluid to the chemical surface treatment device 160. The flush fluid is a material that removes residual chemical in the line connected the valve 148 and the device 160 as well as residual chemicals in the device. As used in this document, "chemical surface treatment material" means any substance applied to another material that increases the surface energy of the material. Such materials include, for example, BondAid1 and BondAid2 Adhesion Promoters, both available from the Triangle division of INX International Ink Co. of Schaumsburg, Ill., and ZE680 and ZE1000 Adhesion Promoters from FujiFilm North America Corporation, Graphic Systems Division. As used in this document, "flush fluid" refers to any material that successfully removes a chemical surface treatment material from the line to the device 160 and from the device 160 as well. Such fluids include, for example, water, alcohols, hydrocarbons, and the like.

The multi-input valve 152 is pneumatically connected to a plurality of sources of plasma gases that are useful to produce plasma for surface treatment of objects. The controller 140 operates the multi-input valve 152 to couple one of the sources of plasma gases to the plasma surface treatment device 164 exclusively. As used in this document, "plasma surface treatment device" means a device that applies an electric voltage or current to a plasma gas to produce a plasma that increases the surface energy of a material. Such a device can be, for example, a plasma generator or a plasma probe. The controller 140 also operates a voltage or current source in the device 164 to form the plasma with the plasma gas released to the device. By selectively operating the plasma surface treatment device 164 as the actuators 168 move the head 172 and rotate the object 120, the plasma discharged from the plasma surface treatment device 160 can be applied to different areas of the object surface selectively. After one or more plasmas is appropriately applied to the object surface, the controller operates the multi-input valve 152 to decouple the connected source of plasma gas from the plasma surface treatment device 164. As used in this document, "plasma gas" means any gas that produces plasma in the presence of an electric voltage or current. Such gases include, for example, oxygen, argon, nitrogen, hydrofluorocarbons, and carbon tetrachloride.

The controller 140 can be configured with programmed instructions stored in a memory operatively connected to the controller to enable the controller to perform different types of surface treatments on one or more objects. A controller so configured can perform the process 200 shown in FIG. 2. To enable the performance of this process in one embodiment of the system 100 shown in FIG. 1, a user interface 182 is provided so a user can input a code that identifies an object and the material of which the object is made. Other methods of entering a code include a bar code reader or other indicia detecting sensors.

Figure 2:
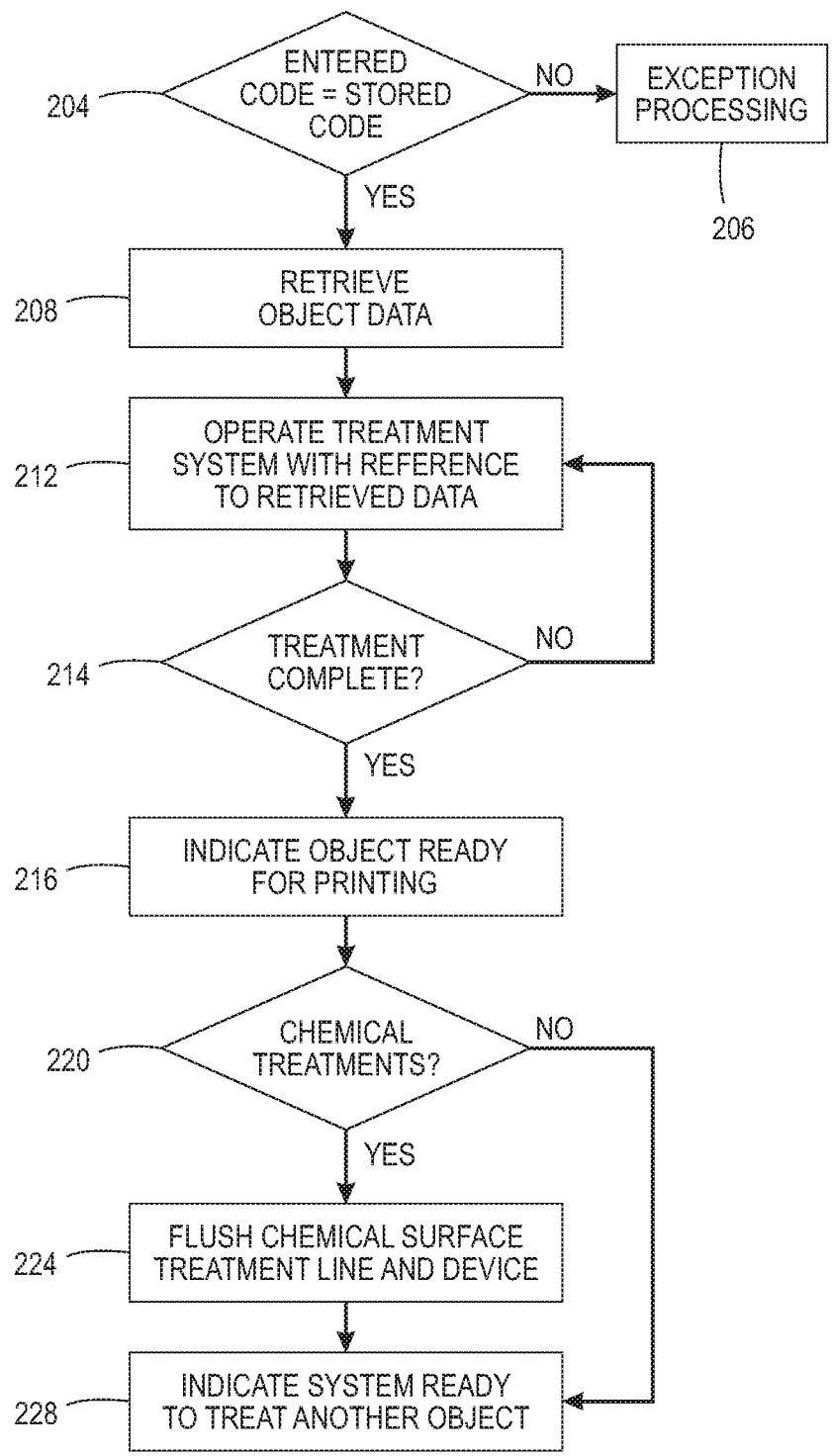
FIG. 2 is a flow diagram that can be performed by the system of FIG. 1.

With reference to FIG. 2, the process 200 begins with the controller comparing a code entered for an object with codes stored in the memory connected to the controller (block 204). If the code corresponds to one stored in the memory, the controller obtains data regarding the physical configuration of the object and the one or more treatments to be applied to the object (block 208). Otherwise, the process performs exception processing (block 206) to handle the lack of a stored code corresponding to the entered code. The controller operates the system 104 as described above to apply at least one treatment to at least one area of the object surface (block 212). This processing can include multiple treatments being applied to one or more same areas of the object or multiple treatments being applied to different areas of the object. Once the surface treatment of the object is complete (block 214), the controller generates a signal indicating the object is ready for printing (block 216). This signal can activate a display or annunciator on the user interface 182 or other known device for indicating a system status. After the treated object leaves the system 104, the controller determines whether any chemical surface treatments were performed (block 220). If any were, then the controller operates the multi-input valve 148 to flush the line to the chemical surface treatment device 160 and the device (block 224). The controller then generates a signal indicative that the system 104 is ready for treatment of another object (block 228).

Figure 3:
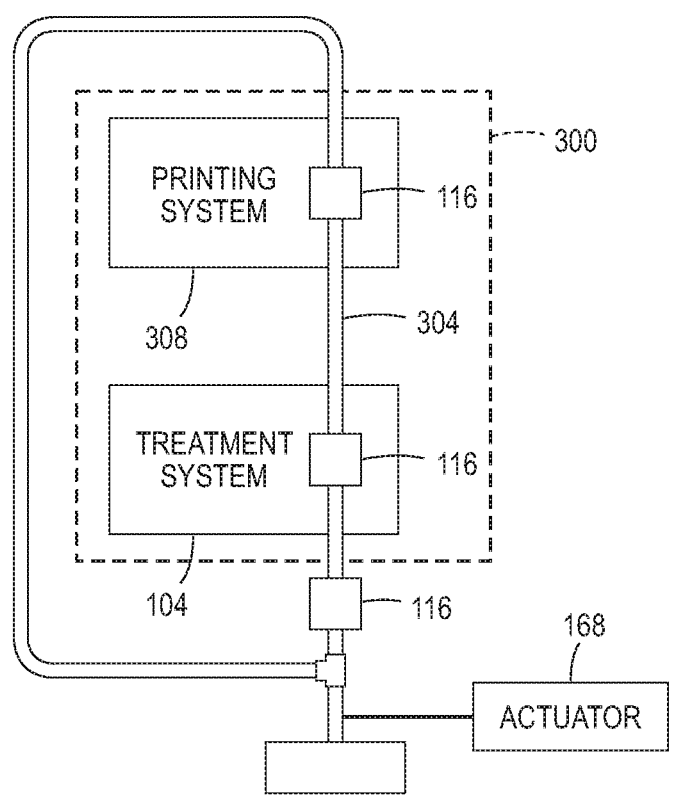
FIG. 3 is a block diagram of a printer integrated with the system of FIG. 1.

FIG. 3 is a block diagram of a printer 300 that integrates a printing system 308 with the surface treatment system 104. In this printer, the holder 116 is mounted for movement along support member 304 and the controller 140 operates actuator 168 to move the holder along the member. In this printer, the support member extends out of the system 104 to position the holder 116 at an initial position where an object can be mounted in the holder for movement into the system 104. After the object is moved into the system 104, the system is operated as previously described to treat the surface of the object. When surface treatment of the object is completed, the controller operates actuator 168 to directly convey the object from the system 104 and into the printing system 308. As used in this document, the term "directly conveyed" means a movement of an object from a surface treatment system to a printing system without removal of the object from the holder used to secure the object within the surface treatment system. Printing system 308 is a DTO printer having a controller that detects the entry of the treated object and operates the printer to eject marking materials on the treated surface of the object to form ink images on the object. The printing system 308 removes the object from the holder 116 and ejects the printed object from the printer. The member 304 can be configured with at least two holders to enable a treated object to be printed, while an untreated object is subjected to at least one of the treatment processes in system 104. If the member 304 includes at least three holders 116, then the system 104 and the printing system 308 of the printer 300 are configured for continuous operation to treat and print a limited run of similar objects because an untreated object can be positioned in a holder 116 while another untreated object is being treated within system 104 and a treated object is being printed in printing system 308 and operation of the actuator 168 moves the holder 116 to feed position below the treatment system 104 while the other two holders 116 are moved into the treatment system and the printing system.

It will be appreciated that variants of the above-disclosed and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the following claims.

What is claimed:

1. An object surface treatment system comprising:
   a holder configured to secure an object within the holder;
   a flame surface treatment device having an ignitor;
   a source of a combustible substance operatively connected to the flame surface treatment device;
   a valve operatively connected between the flame surface treatment device and the source of the combustible substance, the valve being configured to open and close selectively;
   a chemical surface treatment device;
   a plurality of sources of chemical surface treatment materials;
   a source of flush fluid;
   a first multi-input valve operatively connected between the plurality of sources of chemical surface treatment materials, the source of flush fluid, and the chemical surface treatment device, the first multi-input valve being configured to pneumatically connect each source of chemical surface treatment materials and the source of flush fluid to the chemical surface treatment device exclusively of the other sources of chemical surface treatment materials and the source of flush fluid;
   a gas plasma surface treatment device;
   a plurality of sources of plasma gases;
   a second multi-input valve operatively connected between the plurality of sources of plasma gases and the gas plasma surface treatment device, the second multi-input valve being configured to pneumatically connect each source of plasma gas to the gas plasma surface treatment device exclusively of the other sources of plasma gases; and
   a controller operatively connected to the valve, the ignitor within the surface treatment device, the first multi-input valve, and the second multi-input valve, the controller being configured to operate the valve to pneumatically connect the flame surface treatment device to the source of the combustible substance selectively so the combustible substance flows to the ignitor of the flame surface treatment device, to operate the ignitor to form a flame by igniting the combustible substance at the flame surface treatment device to treat a surface of an object in the holder, to operate the first multi-input valve to pneumatically connect the chemical surface treatment device to one of the sources of chemical surface treatment materials in the plurality of sources of chemical surface treatment materials exclusively and independently so the surface of the object in the holder is chemically treated with the chemical surface treatment material in the one source of chemical surface treatment materials connected to the chemical surface treatment device through the first multi-input valve, to operate the first multi-input valve to connect the source of flush fluid to the chemical surface treatment device to flush the chemical surface treatment material used to chemically treat the surface of the object in the holder, and to operate the second multi-input valve to pneumatically connect the plasma gas surface treatment device to one of the sources of plasma gases in the plurality of sources of plasma gasses exclusively and independently.

2. The object surface treatment system of claim 1 further comprising:
   a first elongated support having a first end and a second end, a portion of the holder being mounted about the first elongated support so the holder can move between the first end of the first elongated support and the second end of the first elongated support;
   a first actuator operatively connected to the holder; and
   the controller being operatively connected to the first actuator, the controller being further configured to operate the first actuator to move the holder along the first elongated support to a position opposite the flame surface treatment device, the chemical surface treatment device, and the gas plasma surface treatment device.

3. The object surface treatment system of claim 2 wherein the controller is further configured to operate the first actuator to rotate the holder about the first elongated support.

4. The object surface treatment system of claim 3 further comprising:
   a second elongated support to which the flame surface treatment device, the chemical surface treatment device, and the gas plasma surface treatment device are mounted, the second elongated support having a first end and a second end;
   a second actuator operatively connected to the flame surface treatment device, the chemical surface treatment device, and the gas plasma surface treatment device; and
   the controller being operatively connected to the second actuator, the controller being further configured to operate the second actuator to move the flame surface treatment device, the chemical surface treatment device, and the gas plasma surface treatment device along the second elongated support to a position between the first end and the second end of the second elongated support that is opposite the object in the holder.

5. The object surface treatment system of claim 4 further comprising:
   a data input device operatively connected to the controller; and
   the controller being further configured to:
      receive data from the data input device;
      operate the first and the second actuators using the data received from the data input device to move the flame surface treatment device, the chemical surface treatment device, and the gas plasma surface treatment device between the first end and the second end of the second elongated support and to move the holder between the first and second ends of the first elongated support; and
      operate the flame surface treatment device, the chemical surface treatment device, and the gas plasma surface treatment device using the data received from the data input device.

6. The object surface treatment system of claim 5 further comprising:
   a plurality of actuators, the plurality of actuators being operatively connected to the plurality of surface treatment devices in a one-to-one correspondence to move each of the flame surface treatment device, the chemical surface treatment device, and the gas plasma surface treatment device bidirectionally in a cross-process direction that is perpendicular to the movement of the flame surface treatment device, the chemical surface treatment device, and the gas plasma surface treatment device along the second elongated support.

* * * * *